(12) United States Patent
Haggenmiller

(10) Patent No.: US 11,970,069 B2
(45) Date of Patent: Apr. 30, 2024

(54) DEVICE AND METHOD FOR TESTING THE FUNCTION OF AN ANTENNA SYSTEM FOR FOREIGN METAL DETECTION

(71) Applicant: Vitesco Technologies GmbH, Hannover (DE)

(72) Inventor: Christoph Haggenmiller, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 356 days.

(21) Appl. No.: 17/423,691

(22) PCT Filed: Jan. 15, 2020

(86) PCT No.: PCT/EP2020/050885
§ 371 (c)(1),
(2) Date: Jul. 16, 2021

(87) PCT Pub. No.: WO2020/148321
PCT Pub. Date: Jul. 23, 2020

(65) Prior Publication Data
US 2022/0111742 A1    Apr. 14, 2022

(30) Foreign Application Priority Data

Jan. 16, 2019 (DE) .......................... 102019200470.9

(51) Int. Cl.
*G01R 33/36* (2006.01)
*B60L 53/124* (2019.01)
*G01R 29/08* (2006.01)

(52) U.S. Cl.
CPC ........ *B60L 53/124* (2019.02); *G01R 29/0871* (2013.01)

(58) Field of Classification Search
CPC .................................................. G01R 29/0871
See application file for complete search history.

(56) References Cited

U.S. PATENT DOCUMENTS 8,384,388 B2    2/2013 Biber
8,693,582 B2 *  4/2014 Eliezer .................. G04R 20/10
                                                   343/788

(Continued)

FOREIGN PATENT DOCUMENTS

CN      101750592 A    6/2010
DE      10305741 A1    9/2003
WO      2018159412 A1  9/2018

*Primary Examiner* — Alesa Allgood
(74) *Attorney, Agent, or Firm* — Laurence A. Greenberg; Werner H. Stemer; Ralph E. Locher

(57) ABSTRACT

A device tests the function of an antenna system. The antenna system has a plurality of antennas that are interconnected with an assigned input of a selection unit. The antennas of a first antenna group are interconnected with the inputs of a first multiplexer. The antennas of a second antenna group are interconnected with the inputs of a second multiplexer. The antennas of the first and second antenna groups are arranged adjacently and/or overlap in pairs. A computing unit provides control signals for the selection unit to feed an AC signal into a selected antenna of the first antenna group and to capture the antenna signal present on each antenna of the second antenna group for the selected antenna at an output of the selection unit. A fault is inferred from the comparison of the determined antenna signals for the selected antenna and associated expected antenna signals.

17 Claims, 3 Drawing Sheets

(56) References Cited

U.S. PATENT DOCUMENTS

| | | |
|---|---|---|
| 10,587,330 B2 | 3/2020 | Hoshi et al. |
| 2006/0082494 A1 | 4/2006 | Deininger et al. |
| 2012/0014469 A1 | 1/2012 | Zhou |
| 2013/0169466 A1* | 7/2013 | Frederick .............. G01S 13/887 |
| | | 342/22 |
| 2014/0015522 A1* | 1/2014 | Widmer .................. H02J 50/60 |
| | | 324/239 |
| 2014/0159651 A1 | 6/2014 | Von Novak et al. |
| 2014/0256376 A1* | 9/2014 | Weissman .............. H04B 17/14 |
| | | 455/550.1 |
| 2015/0280623 A1* | 10/2015 | Fujie ...................... G01R 31/42 |
| | | 318/400.21 |

\* cited by examiner

FIG. 5

| Transmitting antenna | \ Measuring antenna | | | | | | | | | | | | | | | |
|---|---|---|---|---|---|---|---|---|---|---|---|---|---|---|---|---|
| | 16 | 17 | 18 | 19 | 20 | 21 | 22 | 23 | 24 | 25 | 26 | 27 | 28 | 29 | 30 | 31 |
| 0 | H | | | | | | | | | | | | | | | |
| 1 | H | H | | | | | | | | | | | | | | |
| 2 | | H | H | | | | | | | | | | | | | |
| 3 | | | H | H | | | | | | | | | | | | |
| 4 | L | L | | | | | | | | | | | | | | |
| 5 | L | L | | | | | | | | | | | | | | |
| 6 | | L | L | | | | | | | | | | | | | |
| 7 | | | L | L | | | | | | | | | | | | |
| 8 | | | | | H | H | H | L | H | H | | L | | | | |
| 9 | | | | | H | H | H | L | H | H | | | | | | |
| 10 | | | | | | | | | H | H | H | H | | | | |
| 11 | | | | | L | L | | L | | L | H | H | | | | |
| 12 | | | | | | L | L | | L | L | | L | H | H | | |
| 13 | | | | | | | | | | | | | H | H | H | |
| 14 | | | | | | | | | | L | L | L | | | H | H |
| 15 | | | | | | | | | | | L | L | | | H | H |

DEVICE AND METHOD FOR TESTING THE FUNCTION OF AN ANTENNA SYSTEM FOR FOREIGN METAL DETECTION

BACKGROUND OF THE INVENTION

Field of the Invention

The invention relates to a device and a method for testing the function of an antenna system, which is used in particular for foreign metal detection. In particular, the invention relates to function testing for selection elements.

Inductive charging involves energy being transmitted by means of the transformer principle over distances of between a few centimeters and approx. 20 cm. A large magnetic field can be produced between an external floor coil (so-called primary coil) and an on-vehicle underbody coil (so-called secondary coil), depending on distance, design and power. The worse the two coils are aligned, the greater the stray magnetic field (EMC) can become, the greater the magnetic exposure for people can become and/or the less power can be transferred to the vehicle's battery. In addition, the efficiency of the transmission system deteriorates.

The alternating magnetic field produced in the air gap during the energy transfer leads to a metallic body in the air gap, such as a coin, a nail and the like, being heated owing to the high transmission power. The temperatures arising in the metallic body can become so high that the housing enclosing the external floor coil, which is usually made of a plastic, could be damaged. In addition, there is the risk that the hot metallic body could ignite combustible materials in the vicinity, such as e.g. paper, which means that there is the risk of a major fire resulting. On the other hand, if a person tries to remove the already heated metallic object from the external floor coil, there is the risk of burns.

Inductive motor vehicle charging systems therefore have the need for so-called foreign metal detection, which deactivates the external floor coil and/or outputs a warning when a metallic object is detected in the floor gap. Since such foreign metal detection can also have a defect, the sensor system used therefor must be regularly checked for its functionality.

SUMMARY OF THE INVENTION

It is the object of the invention to specify a device and a method for testing the function of an antenna system used for foreign metal detection in an inductive motor vehicle charging system that are simple, inexpensive and reliable. In particular, the aim is to allow a diagnosis of the correct actuation (selection) of the receiving antennas before and during the operation of the inductive charging system.

These objects are achieved by means of a device according to the features of independent patent device claim and a method according to the features of independent patent method claim. Advantageous configurations emerge from the dependent patent claims.

According to a first aspect, a device for testing the function of an antenna system, in particular for foreign metal detection, is proposed. The device and the antenna system are, in particular, components of an inductive motor vehicle charging system. The device comprises an antenna system having a plurality of antennas that are interconnected with an assigned input of a selection unit of the device. The antennas of a first antenna group of the plurality of antennas are interconnected with the inputs of a first multiplexer of the selection unit. The antennas of a second antenna group of the plurality of antennas are interconnected with the inputs of a second multiplexer of the selection unit. The antennas of the first antenna group and the antennas of the second antenna group are arranged adjacently and/or so as to overlap in pairs. A computing unit of the device is designed to provide control signals for the selection unit in order to feed an AC signal into a selected antenna of the first antenna group. The computing unit of the device is further designed to capture the antenna signal present on each antenna of the second antenna group for the selected antenna of the first antenna group at an output of the selection unit and to store said antenna signal for a subsequent evaluation. The computing unit infers a fault in the selected antenna/the antenna system from the comparison of the determined antenna signals for the selected antenna of the first antenna system and associated expected antenna signals.

The principle underlying the device according to the invention is based on the fact that the antennas of the first antenna group are arranged relative to the antennas of the second antenna group in such a way that when an AC signal is fed into one of the antennas of the first antenna group (which is referred to as the selected antenna), there is a resultant magnetic coupling to the antennas of the second antenna group, which overlap the selected antenna of the first antenna group or are arranged immediately adjacently thereto. An overlap results in there being strong magnetic coupling; an immediate adjacency relationship usually results in there still being a weak magnetic coupling. The known local relationships of the antennas of the first and second antenna groups mean that the expected antenna signals from each of the antennas of the second antenna group are known for any selected antenna. A discrepancy between the measured antenna signals and the expected antenna signals can be used to infer a fault in the antenna system, in particular in the elements of the selection unit.

The check on the functionality of the device can be used before and during the operation of the inductive charging device mentioned at the outset.

The device can be implemented in a simple and inexpensive manner. In particular, only a few additional components are necessary compared to conventional antenna systems for foreign metal detection. The functionality can be checked using the existing signal analysis structures. An evaluation of the functionality can be implemented by the computing unit in the form of software.

According to an expedient configuration, the AC signal is generated by a diagnostic circuit, wherein the diagnostic circuit comprises a series circuit comprising a switching element controllable by the computing unit and an AC voltage source. The AC voltage source is couplable to an output of the first multiplexer via the controllable switching element. The diagnostic circuit is the only additional component required compared to conventional antenna systems. This allows the provision of the AC signal, which is used to exploit the coupling relationships of the antennas of the first and second antenna groups.

It is also expedient if the selection unit comprises a third multiplexer interconnected in a cascade arrangement with the first and second multiplexers. As a result of the cascade arrangement, the inputs of the third multiplexer are connected to a respective assigned output of the first and second multiplexers. The output of the third multiplexer forms the output of the selection unit. The output of the third multiplexer is coupled to an input of the computing unit for transmitting the antenna signals. This configuration allows the sequential capture of antenna signals of the number of antennas for foreign metal detection when the antenna system is operating as intended. In addition, the cascade arrangement allows the AC signal to be fed into the antennas of the first antenna group while the antenna signals of the antennas of the second antenna group are (can be) measured.

To measure the antenna signals of the antennas of the second antenna group, the third multiplexer permanently connects the output of the second multiplexer to its output during the function test by means of a control signal from the computing unit.

The computing unit is expediently designed so as, for a complete test of the antenna system, to feed an AC signal sequentially into a respective selected antenna of the first antenna group, to capture the antenna signal present on each antenna of the second antenna group for the currently selected antenna of the first antenna group at an output of the selection unit and to store said antenna signal for a subsequent evaluation, and to infer a fault in the antenna system from the comparison of the determined antenna signals for all antennas of the first antenna system and associated expected antenna signals. The procedure described above is thus repeated in accordance with the number of antennas in the first antenna group, as a result of which a results table is obtained that is compared with a predefined expected results table. The comparison is made for corresponding positions in the two tables. An entry in column x and row y (x, y) in the results table is compared with a corresponding entry (x, y) in the expected results table. The comparison is made for all table entries.

The comparison of the first and second results tables can further be used by the computing unit to infer an error in one of the multiplexers of the selection unit. For example, the computing unit can be designed to determine whether the correct antenna of the first antenna group is selected. Alternatively or additionally, the computing unit can be designed to determine whether the correct antennas of the second antenna group are selected.

According to a second aspect, a method for testing the function of an antenna system, in particular for foreign metal detection, is proposed. The antenna system comprises a plurality of antennas that are each interconnected with an assigned input of a selection unit. The antennas of a first antenna group of the plurality of antennas are interconnected with the inputs of a first multiplexer of the selection unit. The antennas of a second antenna group of the plurality of antennas are interconnected with the inputs of a second multiplexer of the selection unit. The antennas of the first antenna group and the antennas of the second antenna group are arranged adjacently and/or so as to overlap in pairs. The method involves control signals being provided for the selection unit. Furthermore, an AC signal is fed into a selected antenna of the first antenna group. The antenna signal present on each antenna of the second antenna group is captured for the selected antenna of the first antenna group at an output of the selection unit and is stored for a subsequent evaluation. A comparison of the determined antenna signals for the selected antenna of the first antenna system and associated expected antenna signals is used to infer a fault in the selected antenna/the antenna system.

The method has the same advantages as those described above in connection with the device according to the invention.

For a complete test of the antenna system, an AC signal is expediently fed sequentially into a respective selected antenna of the first antenna group. The antenna signal present on each antenna of the second antenna group is captured for the currently selected antenna of the first antenna group at an output of the selection unit and is stored for a subsequent evaluation. The comparison of the determined antenna signals for all antennas of the first antenna system and associated expected antenna signals is used to infer a fault in the antenna system.

According to a further expedient embodiment, an error in one of the multiplexers of the selection unit is inferred from the comparison. In particular, the comparison is used to determine whether the correct antenna of the first antenna group is selected. Furthermore, the comparison is used to determine whether the correct antennas of the second antenna group are selected.

The invention is described in greater detail below on the basis of an exemplary embodiment in the drawing.

BRIEF DESCRIPTION OF THE SEVERAL VIEWS OF THE DRAWING

FIG. 5 shows an expected results table in the form of a matrix, depicting result states for the function test on the antenna system according to FIG. 4 if there is no fault in the antenna system.

DETAILED DESCRIPTION OF THE INVENTION

Figure 1:
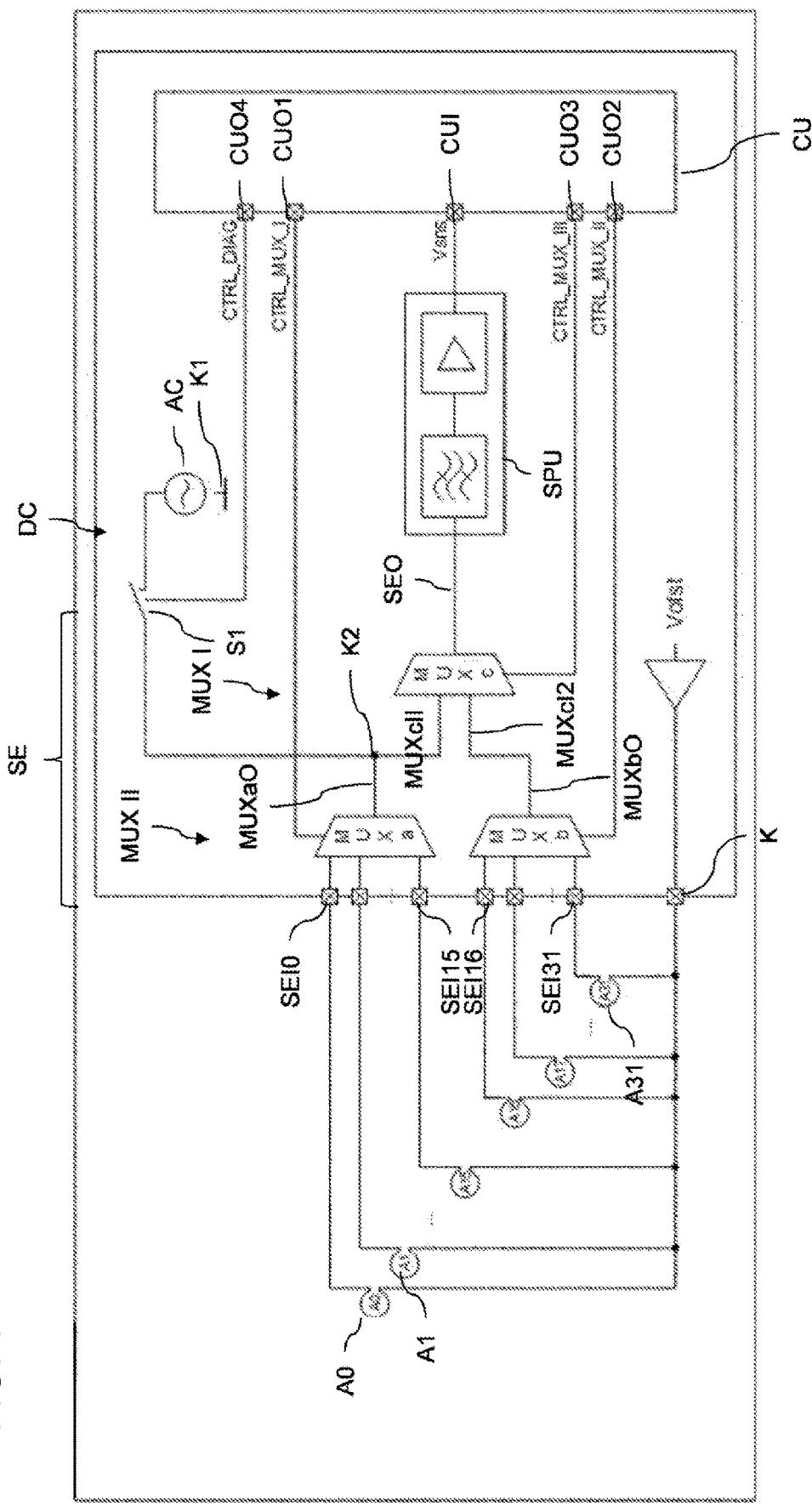
FIG. 1 shows a schematic depiction of an electrical equivalent circuit diagram for a device according to the invention for testing the function of an antenna system for foreign metal detection.

FIG. 1 shows a schematic depiction of an electrical equivalent circuit diagram for a device according to the invention for testing the function of an antenna system. The antenna system is used for foreign metal detection, which responds to detection of a metallic object, for example a coin, a screw, a nail and the like, by outputting a warning and/or deactivating a technical system connected to the device. The device is used to be able to check defects in the antenna system and signal processing components connected to the antenna system for their functionality.

In particular, the device described below is intended for use in an inductive vehicle charging system that involves energy being transmitted by means of the transformer principle over distances of between a few centimeters and approx. 20 cm. Such an energy transmission system involves a large magnetic field being created between an external floor coil and an on-vehicle underbody coil, depending on distance, design and power. When the floor coil is active, a metallic body located in the effective area of the floor coil can be heated. The temperatures arising in the metallic body can become so high that the housing enclosing the external floor coil, which is typically made of a plastic, can be damaged. In addition, there is the risk that the hot metallic body can ignite combustible substances in the vicinity. There is also the risk of burns for living beings that come into contact with the already heated metallic object.

The device described below allows a function test on the antenna system, in particular selection units (e.g. multiplexers) used therein, with regard to malfunctions or incorrect selections.

In the description of the present exemplary embodiment, the antenna system to be tested comprises $2^n=32$ antennas A0, ..., A31, the number n being able to be chosen to be greater or less than 5, in principle. Each of the antennas A0, ..., A31 is interconnected in each particular case between a node K biased with a bias voltage Vofst and an input SEI0, ..., SEI31, assigned to the respective antenna A0, ..., A31, of a selection unit SE. Depending on the voltage supply (not shown), the bias voltage can have a positive or a negative value (in the case of a unipolar voltage supply) or can be at a ground potential.

In the exemplary embodiment shown in FIG. 1, the selection unit SE consists of a cascade of multiplexers MUXa, MUXb, MUXc. The selection unit has the two cascade stages MUX I and MUX II. In the present exemplary embodiment, the cascade stage MUX II, which represents the input of the selection unit SE, has two multiplexers MUXa, MUXb, which have the same number of inputs, namely $2^n/2=16$. The cascade stage MUX I, which represents the output SEO of the selection unit SE, has the multiplexer MUXc. The outputs MUXaO, MUXbO of the multiplexers MUXa, MUXb of the second cascade stage MUX II are accordingly connected to the inputs MUXcI1, MUXcI2 of the multiplexer MUXc of the first cascade stage MUX I. An output of the multiplexer MUXc represents an output SEO of the selection unit SE.

The output SEO of the selection unit SE is connected to an input CUI of a computing unit CU via a signal processing unit SPU, which comprises, for example, a filter and an amplifier and the like. The computing unit CU is designed to provide control signals CTRL_MUX_I, CTRL_MUX_II and CTRL_MUX_III for the multiplexers MUXa, MUXb, MUXc of the selection unit SE at various outputs CUO1, CUO2, CUO3, the control signals determining which input SEI0, ..., SEI31 of the selection unit SE is to be connected to the output SEO of the selection unit SE when the antenna system is operating as intended. This allows the computing unit to determine which antenna A0, ..., A31 is connected to the computing unit for evaluating an antenna signal.

The computing unit CU is further designed to receive at its input CUI the antenna signal present at the output SEO of the selection unit SE and processed by the signal processing unit SPU.

The device further comprises a diagnostic circuit DC. The diagnostic circuit DC comprises a series circuit comprising a controllable switching element S1 and an AC voltage source AC. The series circuit comprising the controllable switching element S1 and the AC voltage source AC is interconnected between a reference-ground potential connection K1 and a node K2, which connects the output MUXaO of the first multiplexer MUXa and a first input MUXcI1 of the third multiplexer MUXc to one another. The controllable switching element S1 is controlled using a control signal CTRL_DIAG, which is output at a fourth output CUO4 by the computing unit CU.

To carry out the function test, the diagnostic circuit DC is activated by connecting the AC voltage source AC to the node K2 by means of the controllable switching element S1. At the same time, the control signal CTRL_MUX_III is used to connect the second input MUXcI2 of the third multiplexer MUXc to the output MUXbO of the second multiplexer MUXb. Depending on the control signal CTRL_MUX_I, which stipulates which of the inputs SEI0, ..., SEI15 of the selection unit (which correspond to applicable inputs of the first multiplexer MUXa) is selected, the antenna A0, ..., A15 connected to this input has the AC signal applied to it that allows the function test on the antenna system on the basis of specific properties of the arrangement of the antennas, which are described below.

The antennas A0, ..., A31 are divided into two antenna groups—a first antenna group and a second antenna group—the affiliation of an antenna to the first or to the second antenna group being dependent on whether it is connected to an input of the first multiplexer MUXa or to an input of the second multiplexer MUXb. In the present description, the antennas A0, ..., A15, which are coupled to the first multiplexer MUXa, are antennas of the first antenna group. The antennas A16, ..., A31, which are coupled to the second multiplexer MUXb, are antennas of the second antenna group.

Figure 2:
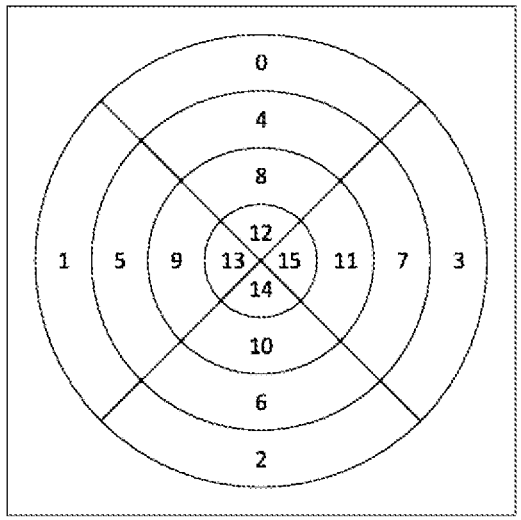
FIG. 2 shows an illustrative depiction of the arrangement of antennas of a first antenna group of the antenna system from FIG. 1.

FIG. 2 shows an illustrative arrangement of the 16 antennas A0, ..., A15 of the first antenna group, the figure depicting only the number of the antenna without the letter "A". By way of illustration, the antennas A0, ..., A15 (in line with the depiction in FIG. 2 "0", ..., "15") are in the form of circular arcs that are arranged on four imaginary circles around a center point and have a respective center point angle of $\alpha=90°$.

The arrangement of the 16 antennas A16, ..., A31 of the second antenna group is analagous, FIG. 3 again depicting only the number of the antenna without the letter "A". The antennas A16, ..., A31 (in line with the depiction in FIG. 2 "16", ..., "31") are accordingly in the form of circular arcs that are arranged on four imaginary circles around a center point and have a respective center point angle of $\alpha=90°$. The entire arrangement is rotated through 45° with respect to the arrangement from FIG. 2.

Figure 3:
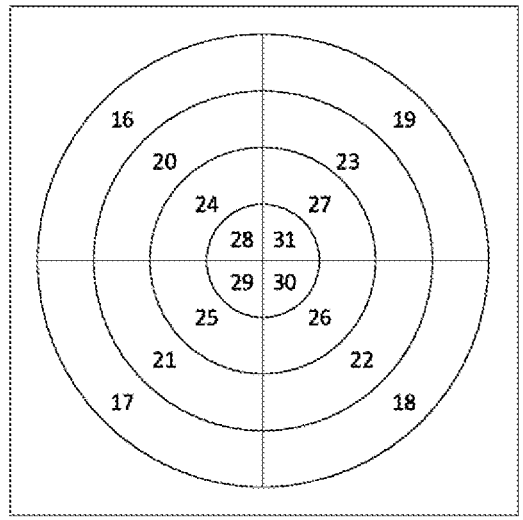
FIG. 3 shows an illustrative depiction of the arrangement of antennas of a second antenna group of the antenna system from FIG. 1.
Figure 4:
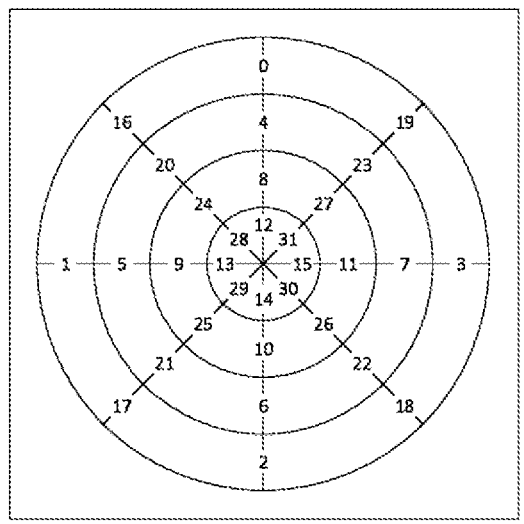
FIG. 4 shows a depiction of the antenna system that results from the arrangement of the antenna groups shown in FIGS. 2 and 3 one above the other.

In the antenna system according to FIG. 1, the two antenna groups shown in FIG. 2 and FIG. 3 are arranged one above the other, i.e. the center points of the two arrangements are positioned one above the other, as FIG. 4 shows. It can readily be seen that the antennas, which are located on a respective imaginary circle around the center point, overlap in pairs by 50%, i.e. have a (strong) magnetic coupling when an AC signal is fed in. The coupling can also exist—very much more weakly—with adjacent antennas that lie on an adjacent imaginary circle.

The principle underlying the device according to the invention is therefore based on the fact that the antennas of the first antenna group are arranged relative to the antennas of the second antenna group in such a way that when an AC signal is fed into one of the antennas of the first antenna group (which is referred to as the selected antenna), there is a resultant magnetic coupling to the antennas of the second antenna group, which overlap the selected antenna of the first antenna group or are arranged immediately adjacently thereto. An overlap results in there being a strong magnetic coupling; an immediate adjacency relationship usually results in there still being a weak magnetic coupling. The known local relationships of the antennas of the first and second antenna groups mean that the expected antenna signals from each of the antennas of the second antenna group are known for any selected antenna of the first antenna group. A discrepancy between the measured antenna signals and the expected antenna signals can be used to infer a fault in the antenna system, in particular in the elements of the selection unit.

FIG. 5 shows a matrix (table) depicting the result values (measurement signals) at the antennas A16, ..., A31 of the second antenna group (so-called measuring antennas) for the possible actuation situations of the antennas A0, ..., A15 of the first antenna group (so-called transmitting antenna) if there is no malfunction in the multiplexers MUXa, MUXb, MUXc and also no error in the selection. The matrix contains an entry "H" if a strong coupling is detected by the computing unit CU between the selected (transmitting) antenna A0, ..., A15 when the AC signal is fed in and a measuring antenna (i.e. an antenna A16, ..., A31 of the second antenna group). For example, FIG. 4 shows that the (transmitting) antenna A2 (=antenna of the first antenna group) is arranged so as to overlap the (measuring) antennas A17, A18 (=antennas of the second antenna group) on the outermost imaginary circle. This results in a strong magnetic coupling between the antennas A2 and A17, A18. In contrast, the adjacent antennas A21, A22 of the second antenna group couple only weakly, which is why an entry "L" is made in the matrix. The other matrix entries are obtained analogously for the antenna system shown in FIG. 4.

To carry out the function test, each of the (transmitting) antennas A0, ..., A15 (=antenna of the first antenna group) in succession has the AC signal applied to it. While a respective one of the transmitting antennas has the AC signal applied to it, the measurement signal is captured for the (measuring) antennas A16, ..., A31 (=antennas of the second antenna group), and so a results table as shown in FIG. 5 is generated, which is compared with the expected results table shown in FIG. 5.

If there is a discrepancy, an error in one of the multiplexers MUXa, MUXb, MUXc of the selection unit is then inferred. For example, the computing unit can be designed to determine whether the correct antenna of the first antenna group is selected. Alternatively or additionally, the computing unit can be designed to determine whether the correct antennas of the second antenna group are selected.

The invention claimed is:

1. A device for testing a function of antennas, the device comprising:
   a selection unit having inputs, an output, a first multiplexer with inputs and a second multiplexer with inputs;
   an antenna system having a plurality of antennas, each one of said plurality of antennas being interconnected with a respective one of said inputs of said selection unit, wherein said antennas of a first antenna group of said plurality of antennas are interconnected with said inputs of said first multiplexer of said selection unit on a one-to-one basis, wherein said antennas of a second antenna group of said plurality of antennas are interconnected with said inputs of said second multiplexer of said selection unit on a one-to-one basis, and wherein said antennas of said first antenna group and said antennas of said second antenna group are disposed adjacently and/or so as to overlap in pairs;
   a computing unit configured to:
      provide control signals for said selection unit to feed an AC signal into a selected antenna of said first antenna group;
      capture an antenna signal present on each of said antennas of said second antenna group for said selected antenna of said first antenna group at said output of said selection unit;
      store the antenna signal for a subsequent evaluation; and
      infer a fault in said selected antenna or the antenna system from a comparison of determined antenna signals for said selected antenna of said first antenna group and associated expected antenna signals.

2. The device according to claim 1, wherein said computing unit is configured so as, for a complete test of said antenna system, to:
   provide controls signals for said selection unit to feed the AC signal sequentially into a respectively selected antenna of said first antenna group;
   capture the antenna signal present on each of said antennas of said second antenna group for the selected antenna of said first antenna group at said output of said selection unit and to store the antenna signal for a subsequent evaluation; and
   infer a fault in said antenna system from the comparison of the determined antenna signals for all of said antennas of said first antenna group and the associated expected antenna signals.

3. The device according to claim 1, wherein the device is provided for foreign metal detection.

4. The device according to claim 1, further comprising a diagnostic circuit, the AC signal is generated by said diagnostic circuit, said diagnostic circuit containing a series circuit having a controllable switching element controllable by said computing unit and an AC voltage source, said AC voltage source being couplable to an output of said first multiplexer via said controllable switching element.

5. The device according to claim 4, wherein said first multiplexer is configured to pass the A/C signal provided on said output of said first multiplexer to said selected antenna of the first antenna group.

6. The device according to claim 1, wherein said selection unit has a third multiplexer interconnected in a cascade configuration with said first and second multiplexers, as a result of which inputs of said third multiplexer are connected to a respectively assigned output of said first and second multiplexers and an output of said third multiplexer forms said output of the selection unit, said output of said selection unit is coupled to an input of said computing unit for transmitting the antenna signals.

7. The device according to claim 6, wherein said third multiplexer permanently connects said output of said second multiplexer to said output of said third multiplexer during a function test by means of a control signal from said computing unit.

8. The device according to claim 1, wherein said computing unit is configured to infer an error in one of said multiplexers of said selection unit from the comparison.

9. The device according to claim 8, wherein said computing unit is configured to determine whether a correct antenna of said first antenna group is selected.

10. The device according to claim 8, wherein said computing unit is configured to determine whether correct antennas of said second antenna group are selected.

11. A method for testing a function of an antenna system having a plurality of antennas that are each interconnected with a respective input of a selection unit, wherein the antennas of a first antenna group of the plurality of antennas are interconnected with inputs of a first multiplexer of the selection unit on a one-to-one basis, wherein the antennas of a second antenna group of the plurality of antennas are interconnected with inputs of a second multiplexer of the selection unit on a one-to-one basis, and wherein the antennas of the first antenna group and the antennas of the second antenna group are disposed adjacently and/or so as to overlap in pairs, the method which comprises the steps of:

providing a computing unit which performs the substeps of:
- providing control signals for the selection unit to feed an AC signal into a selected antenna of the first antenna group;
- capturing an antenna signal present on each of the antennas of the second antenna group for the selected antenna of the first antenna group at an output of the selection unit and stores the antenna signal for a subsequent evaluation; and
- inferring a fault in the selected antenna or the antenna system from a comparison of determined antenna signals for the selected antenna of the first antenna system and associated expected antenna signals.

12. The method according to claim 11, wherein the comparison is used to determine whether a correct antenna of the first antenna group is selected.

13. The method according to claim 11, wherein the comparison is used to determine whether correct antennas of the second antenna group are selected.

14. The method according to claim 11, which further comprises determining whether a foreign metal object is present.

15. The method according to claim 11, wherein for a complete test of the antenna system, performing the further steps of:
- feeding the AC signal sequentially into a respective selected antenna of the first antenna group;
- capturing the antenna signal present on each of the antennas of the second antenna group for a currently selected antenna of the first antenna group at an output of the selection unit and is stored for a subsequent evaluation; and
- inferring a fault in the antenna system from a comparison of determined antenna signals for all of the antennas of the first antenna group and the associated expected antenna signals.

16. The method according to claim 11, wherein an error in one of the multiplexers of the selection unit is inferred from the comparison.

17. An inductive charging system for an electrical vehicle containing an outer bottom coil or a vehicle-side underbody coil and a device for testing a function of antennas, wherein the antennas are provided for a detection of a foreign metal object disposed in an effective area of the coil, the device comprising:
- a selection unit having inputs, an output, a first multiplexer with inputs and a second multiplexer with inputs;
- an antenna system having a plurality of antennas, each one of said plurality of antennas being interconnected with a respective one of said inputs of said selection unit, wherein said antennas of a first antenna group of said plurality of antennas are interconnected with said inputs of said first multiplexer of said selection unit on a one-to-one basis, wherein said antennas of a second antenna group of said plurality of antennas are interconnected with said inputs of said second multiplexer of said selection unit on a one-to-one basis, and wherein said antennas of said first antenna group and said antennas of said second antenna group are disposed adjacently and/or so as to overlap in pairs; and
- a computing unit configured to:
  - provide control signals for said selection unit to feed an AC signal into a selected antenna of said first antenna group;
  - capture an antenna signal present on each of said antennas of said second antenna group for said selected antenna of said first antenna group at said output of said selection unit;
  - store the antenna signal for a subsequent evaluation; and
  - infer a fault in said selected antenna or the antenna system from a comparison of determined antenna signals for said selected antenna of said first antenna group and associated expected antenna signals.

* * * * *